(12) United States Patent
Dean

(10) Patent No.: US 6,985,393 B2
(45) Date of Patent: Jan. 10, 2006

(54) DEVICE FOR MARGIN TESTING A SEMICONDUCTOR MEMORY BY APPLYING A STRESSING VOLTAGE SIMULTANEOUSLY TO COMPLEMENTARY AND TRUE DIGIT LINES

(75) Inventor: Danial S. Dean, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/928,400

(22) Filed: Aug. 27, 2004

(65) Prior Publication Data

US 2005/0024964 A1 Feb. 3, 2005

Related U.S. Application Data

(63) Continuation of application No. 10/633,956, filed on Aug. 4, 2003, now Pat. No. 6,829,182, which is a continuation of application No. 10/212,903, filed on Aug. 5, 2002, now Pat. No. 6,611,467, which is a continuation of application No. 09/977,755, filed on Oct. 15, 2001, now Pat. No. 6,442,086, which is a continuation of application No. 09/897,360, filed on Jul. 2, 2001, now Pat. No. 6,327,201, which is a continuation of application No. 09/583,478, filed on May 31, 2000, now Pat. No. 6,256,242, which is a continuation of application No. 09/392,154, filed on Sep. 8, 1999, now Pat. No. 6,101,139, which is a continuation of application No. 09/026,244, filed on Feb. 19, 1998, now Pat. No. 6,002,622.

(51) Int. Cl.
*G11C 29/00* (2006.01)
(52) U.S. Cl. .................. 365/201; 365/202; 365/203
(58) Field of Classification Search ................ 365/149, 365/190, 201, 202, 203; 714/718, 721
See application file for complete search history.

(56) References Cited

U.S. PATENT DOCUMENTS

| | | | |
|---|---|---|---|
| 5,208,778 A | 5/1993 | Kumanoya | |
| 5,265,056 A | 11/1993 | Butler | |
| 5,297,087 A | 3/1994 | Porter | |
| 5,500,824 A | 3/1996 | Fink | |
| 5,523,977 A | 6/1996 | Tobita et al. | |
| 5,544,108 A | 8/1996 | Thomann | |
| 5,610,867 A | 3/1997 | DeBrosse | |
| 5,710,740 A | 1/1998 | Manning | |
| 5,754,486 A * | 5/1998 | Nevill et al. | 365/201 |
| 5,822,258 A | 10/1998 | Casper | |
| 5,877,993 A * | 3/1999 | Biegel et al. | 365/201 |
| 5,903,502 A | 5/1999 | Porter | |
| 5,959,913 A | 9/1999 | Raad | |
| 5,982,682 A | 11/1999 | Nevill et al. | |
| 6,002,622 A | 12/1999 | Dean | |

(Continued)

OTHER PUBLICATIONS

Prince, B., "Semiconductor Memories: A Handbook of Design, Manufacture and Application," (Wiley 1991, reprinted 1996).

*Primary Examiner*—Son Mai
(74) *Attorney, Agent, or Firm*—TraskBritt

(57) ABSTRACT

A margin test on a Dynamic Random Access Memory (DRAM) in accordance with the invention begins with a supply voltage level being stored in all memory cells of the DRAM. Circuitry incorporated into each sense amplifier of the DRAM then isolates the digit line equilibrating circuitry in each sense amplifier from the cell plate voltage DVC2 or supply voltage $V_{CC}$ to which the equilibrating circuitry is normally connected and connects the equilibrating circuitry to ground instead.

63 Claims, 5 Drawing Sheets

U.S. PATENT DOCUMENTS

| | | |
|---|---|---|
| 6,055,199 A | 4/2000 | Hamade et al. |
| 6,061,285 A | 5/2000 | Tsukikawa |
| 6,088,819 A | 7/2000 | Adachi et al. |
| 6,101,139 A | 8/2000 | Dean |
| 6,154,401 A | 11/2000 | Casper et al. |
| 6,256,242 B1 | 7/2001 | Dean |
| 6,266,287 B1 * | 7/2001 | Porter ........................ 365/205 |
| 6,327,201 B2 | 12/2001 | Dean |
| 6,442,086 B1 | 8/2002 | Dean |
| 6,801,469 B2 * | 10/2004 | Cowles .................... 365/225.7 |

* cited by examiner

DEVICE FOR MARGIN TESTING A SEMICONDUCTOR MEMORY BY APPLYING A STRESSING VOLTAGE SIMULTANEOUSLY TO COMPLEMENTARY AND TRUE DIGIT LINES

CROSS-REFERENCE TO RELATED APPLICATIONS

This application is a continuation of application Ser. No. 10/633,956, filed Aug. 4, 2003, now U.S. Pat. No. 6,829,182, issued Dec. 7, 2004; which is a continuation of application Ser. No. 10/212,903, filed Aug. 5, 2002, now U.S. Pat. No. 6,611,467, issued Aug. 26, 2003; which is a continuation of application Ser. No. 09/977,755, filed Oct. 15, 2001, now U.S. Pat. No. 6,442,086, issued Aug. 27, 2002; which is a continuation of application Ser. No. 09/897,360, filed Jul. 2, 2001, now U.S. Pat. No. 6,327,201, issued Dec. 4, 2001; which is a continuation of application Ser. No. 09/583,478, filed May 31, 2000, now U.S. Pat. No. 6,256,242, issued Jul. 3, 2001; which is a continuation of application Ser. No. 09/392,154, filed Sep. 8, 1999, now U.S. Pat. No. 6,101,139, issued Aug. 8, 2002; which is a continuation of application Ser. No. 09/026,244, filed Feb. 19, 1998, now U.S. Pat. No. 6,002,622, issued Dec. 14, 1999.

BACKGROUND OF THE INVENTION

1. Field of the Invention

This invention relates in general to semiconductor memories and, more specifically, to devices and methods for margin testing a semiconductor memory by, for example, equilibrating all complementary and true digit lines of the memory to ground simultaneously during a test mode.

2. State of the Art

As shown in FIG. 1, one conventional method for margin testing a sub-array 10 of a semiconductor memory begins with storing a supply voltage $V_{CC}$ on all memory cell capacitors 12 of the sub-array 10. This is accomplished by writing logical "1" bits to memory cells attached to true digit lines D0, D1, etc., using sense amplifiers 14 and even row lines R0, R2, etc., and by writing logical "0" bits to memory cells attached to complementary digit lines D0*, D1*, etc., using the sense amplifiers 14 and odd row lines R1, R3, etc. A cell plate voltage DVC2 equal to one-half the supply voltage $V_{CC}$ is applied to the cell plate of each memory cell capacitor 12.

Once each memory cell capacitor 12 has stored the supply voltage $V_{CC}$, the row line R0, for example, is fired, causing the memory cells attached to the row line R0 to dump their stored charge from their memory cell capacitors 12 onto the true digit lines D0, D1, etc. This causes the sense amplifiers 14 to pull each of the true digit lines D0, D1 etc., up to the supply voltage $V_{cc}$, and to pull each of the complementary digit lines D0*, D1*, etc., down to ground. As a result, a full $V_{CC}$-to-ground voltage drop is imposed across NMOS access devices 16 of the memory cells attached to the complementary digit lines D0*, DL*, etc. The $V_{cc}$-to-ground voltage drop is maintained across the NMOS access devices 16 for a predetermined refresh interval of typically about 150 to 200 milliseconds (ms). This stresses any "leaky" NMOS access devices 16 and causes any such NMOS access devices 16 to lose significant charge from their memory cell capacitors 12 to the complementary digit lines D0*, D1*, etc., to which they are attached.

Once the predetermined refresh interval is over, all of the memory cells attached to the complementary digit lines D0*, D1*, etc., are read. Any of these cells that read out a logical "1" bit as a result of leaking excessive charge, instead of reading out the logical "0" bit they originally stored, are flagged as failing the margin test.

Once the memory cells attached to the complementary digit lines D0*, D1*, etc., have been tested, the memory cells attached to the true digit lines D0, D1, etc., are tested by firing the row line R1, for example. This causes the memory cells attached to the row line R1 to dump their stored charge from their memory cell capacitors 12 onto the complementary digit lines D0*, D1*, etc. In turn, this causes the sense amplifiers 14 to pull each of the complementary digit lines D0*, D1*, etc., up to the supply voltage $V_{CC}$, and to pull each of the true digit lines D0, D1, etc., down to ground. As a result, a full $V_{CC}$-to-ground voltage drop is imposed across NMOS access devices 18 of the memory cells attached to the true digit lines D0, D1, etc. The $V_{CC}$-to-ground voltage drop is maintained across the NMOS access devices 18 for another predetermined refresh interval of about 150 to 200 ms. This stresses any "leaky" NMOS access devices 18 and causes any such NMOS access devices 18 to lose significant charge from their memory cell capacitors 12 to the true digit lines D0, D1, etc., to which they are attached.

Once the predetermined refresh interval is over, all of the memory cells attached to the true digit lines D0, D1, etc., are read. Any of these cells that read out a logical "0" bit as a result of leaking excessive charge, instead of reading out the logical "1" bit they originally stored, are flagged as failing the margin test.

This conventional margin testing method thus typically takes two predetermined refresh intervals of about 150 to 200 ms. each to complete. Since row lines in different sub-arrays in a semiconductor memory typically cannot be fired simultaneously because the addressing of the row lines is local to their respective sub-arrays, this conventional method cannot be used on more than one sub-array at a time. As a result, in a semiconductor memory containing four sub-arrays, for example, the conventional method described above takes approximately 1.2 to 1.6 seconds to complete. Because of the large number of semiconductor memories that typically require margin testing during production, it would be desirable to find a margin testing method that can be completed more quickly than the method described above.

As shown in FIG. 2, another conventional method for margin testing a semiconductor memory has been devised to conduct margin tests more quickly than the method described above. In this method, a sense amplifier 20 includes equilibrating NMOS transistors 22, which equilibrate true and complementary digit line pairs D0, D0*, etc., to a bias voltage $V_{BIAS}$ on an equilibrate bias node 23 in response to an equilibrate signal EQ. It should be understood that an "equilibrate bias node" is a node to which a cell plate is coupled, and from which a bias voltage is globally distributed for use by equilibrating transistors throughout a semiconductor memory.

When the semiconductor memory is not in a margin test mode, a test mode signal TESTMODE is inactive, so that a PMOS transistor 24 is on and the bias voltage $V_{BIAS}$ on the equilibrate bias node 23 is equal to the cell plate voltage DVC2 on the cell plate 25. When the semiconductor memory is in a margin test mode, the test mode signal TESTMODE is active so that the PMOS transistor 24 isolates the equilibrate bias node 23 from the cell plate 25, and so an NMOS transistor 26 connects the equilibrate bias node 23 to a probe pad 28 positioned on the exterior of the semiconductor memory. A stressing voltage, such as ground, can then be applied to the probe pad 28 during margin testing to simultaneously stress memory cells attached to both the true and complementary digit lines D0, D0*, etc.

Because the method described immediately above does not require the firing of any row lines in order to stress memory cells, all cells in a semiconductor memory can be stressed at once using this method. As a result, this method only requires one predetermined refresh period to complete testing, no matter how many sub-arrays a semiconductor memory contains. Thus, the method dramatically improves the speed with which margin testing can be completed.

Unfortunately, the method described above with respect to FIG. 2 has proven difficult to implement because the PMOS transistor 24 generally does not reliably isolate the equilibrate bias node 23 from the cell plate 25. In addition, the probe pad 28 has proven to be a cumbersome addition to the exterior of a semiconductor memory.

Therefore, there is a need in the art for a device and method for margin testing a semiconductor memory that avoids the problems associated with the probe pad method described above while still providing a rapid margin testing device and method.

BRIEF SUMMARY OF THE INVENTION

Circuitry, in accordance with the invention for margin testing a semiconductor memory, such as a Dynamic Random Access Memory (DRAM), includes switching circuits formed within the memory. Each switching circuit can be conveniently incorporated into a sense amplifier of the memory, and each is associated with a pair of digit lines of the memory to which it selectively applies a stressing voltage at substantially the same time during a margin test mode of the memory. The stressing voltage can be ground when all the memory cells of the memory store a supply voltage level during the margin test, or it can be at the supply voltage level when all the memory cells store a ground voltage level during the margin test. The switching circuits can apply the stressing voltage to the digit line pairs through equilibrating circuitry in the sense amplifiers into which they can be incorporated, or can apply the stressing voltage through other means. Also, isolating circuitry can be provided to isolate the digit line pairs during the margin test from an equilibrate bias node of the memory from which they normally receive a digit line equilibrating bias voltage, such as a cell plate voltage or the supply voltage.

The inventive margin testing circuitry thus stresses all memory cells in the memory at the same time without the need to fire individual row lines in different sub-arrays. As a result, it substantially reduces the time it takes to complete a margin test of the memory. Also, by positioning the switching circuits within the memory, the inventive margin testing circuitry avoids the cumbersome nature of the external probe pad of prior margin testing devices.

In other embodiments of the invention, a semiconductor memory, an electronic system, and a semiconductor substrate (e.g., a semiconductor wafer) incorporate the inventive margin testing circuitry described above.

In another embodiment of the invention—a method of margin testing a DRAM—a high voltage level is stored in memory cells of the DRAM. Equilibrating circuitry in sense amplifiers of the DRAM is isolated from an equilibrate bias node of the DRAM and from a cell plate voltage thereon, and a ground voltage from within the DRAM is applied to the equilibrating circuitry in each sense amplifier. Digit line pairs of the DRAM are then equilibrated to the ground voltage using the equilibrating circuitry in each sense amplifier, and the digit line pairs are held at the ground voltage for a predetermined refresh interval in order to stress the memory cells of the DRAM, which are attached to the digit line pairs. After the predetermined refresh interval has passed, all the memory cells of the DRAM are read to identify those that have failed the margin test. The refresh interval may be, for example, about 150 to 200 milliseconds.

In still another embodiment of the invention—a method of testing a semiconductor memory—a substantially identical logic voltage is stored in all memory cells of the semiconductor memory. Also, digit line pairs of the semiconductor memory that are attached to the memory cells are isolated from a digit line equilibrating bias voltage. This is accomplished by deactivating an NMOS transistor coupled between the bias voltage and the digit line pairs, or by failing to activate equilibrate circuitry coupled between the bias voltage and the digit line pairs that normally is activated during memory operations of the semiconductor memory. A stressing voltage from within the semiconductor memory that is substantially different than the logic voltage stored in the memory cells is then applied to all the digit lines of all the digit line pairs at substantially the same time, thereby stressing the memory cells. The digit line pairs are held at the stressing voltage for a predetermined interval, and all the memory cells of the semiconductor memory are then read to identify those that have failed the test.

DETAILED DESCRIPTION OF THE INVENTION

Figure 1:
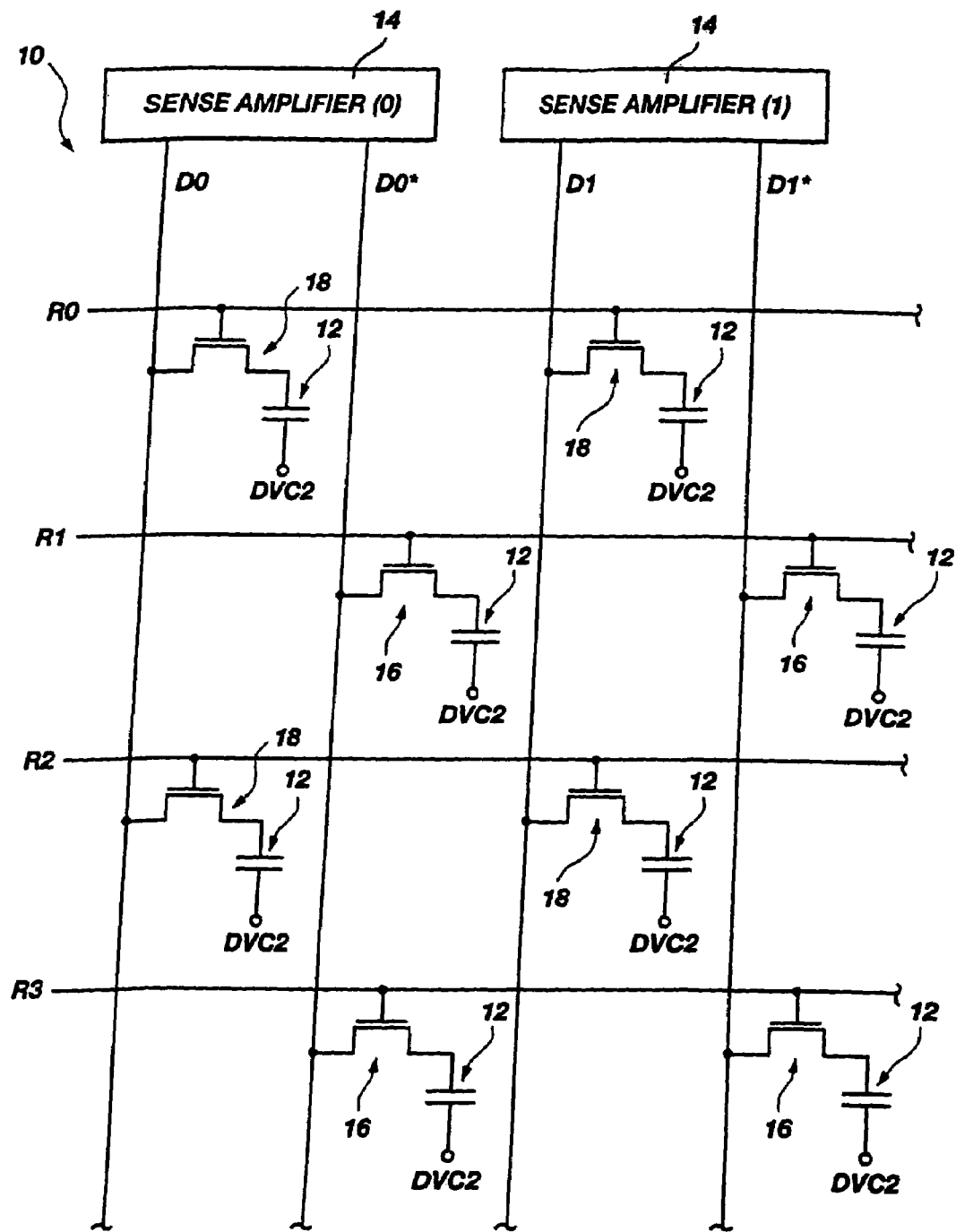
FIG. 1 is a schematic and block diagram illustrating a conventional method for margin testing a semiconductor memory.
Figure 2:
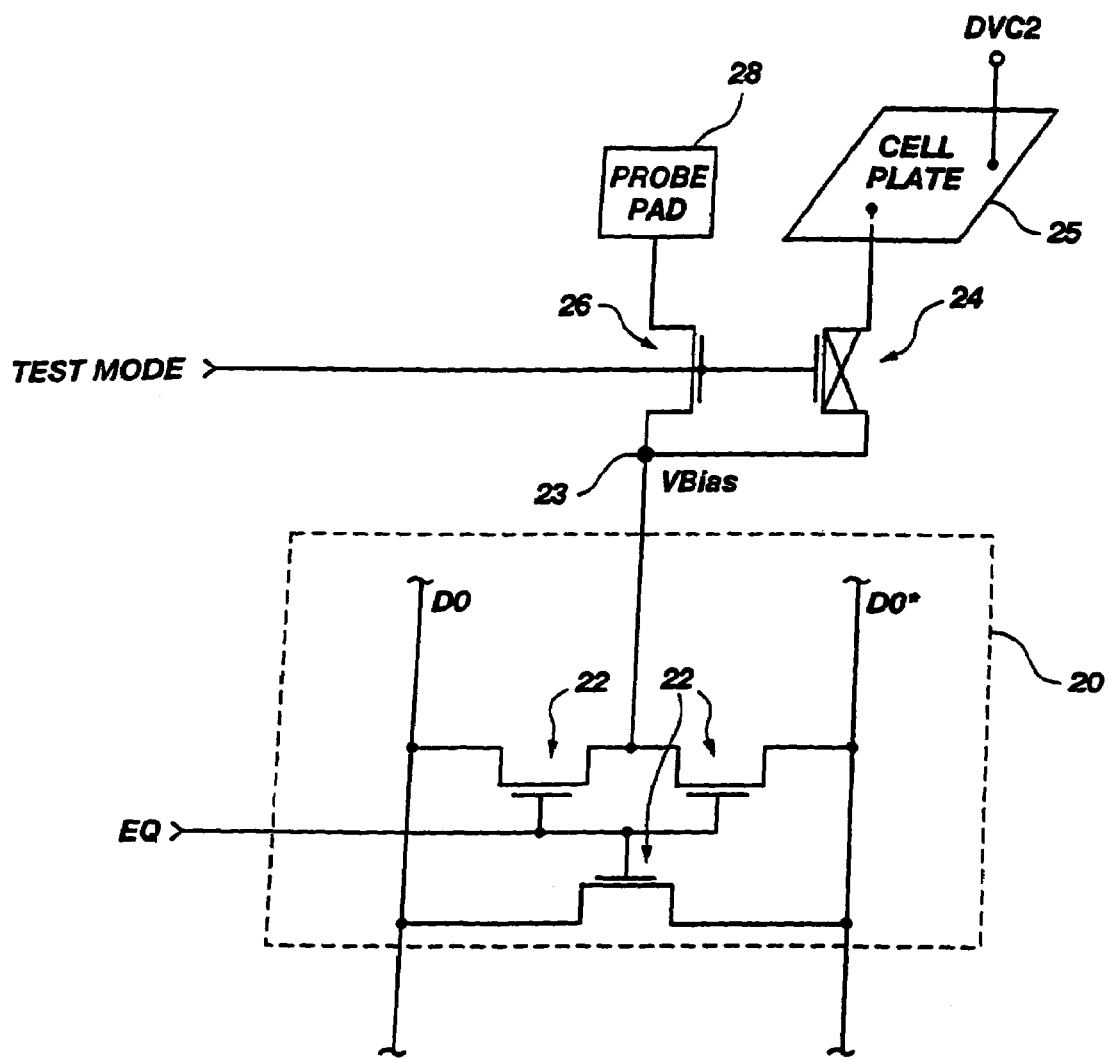
FIG. 2 is a schematic diagram illustrating another prior art method for margin testing a semiconductor memory.
Figure 3:
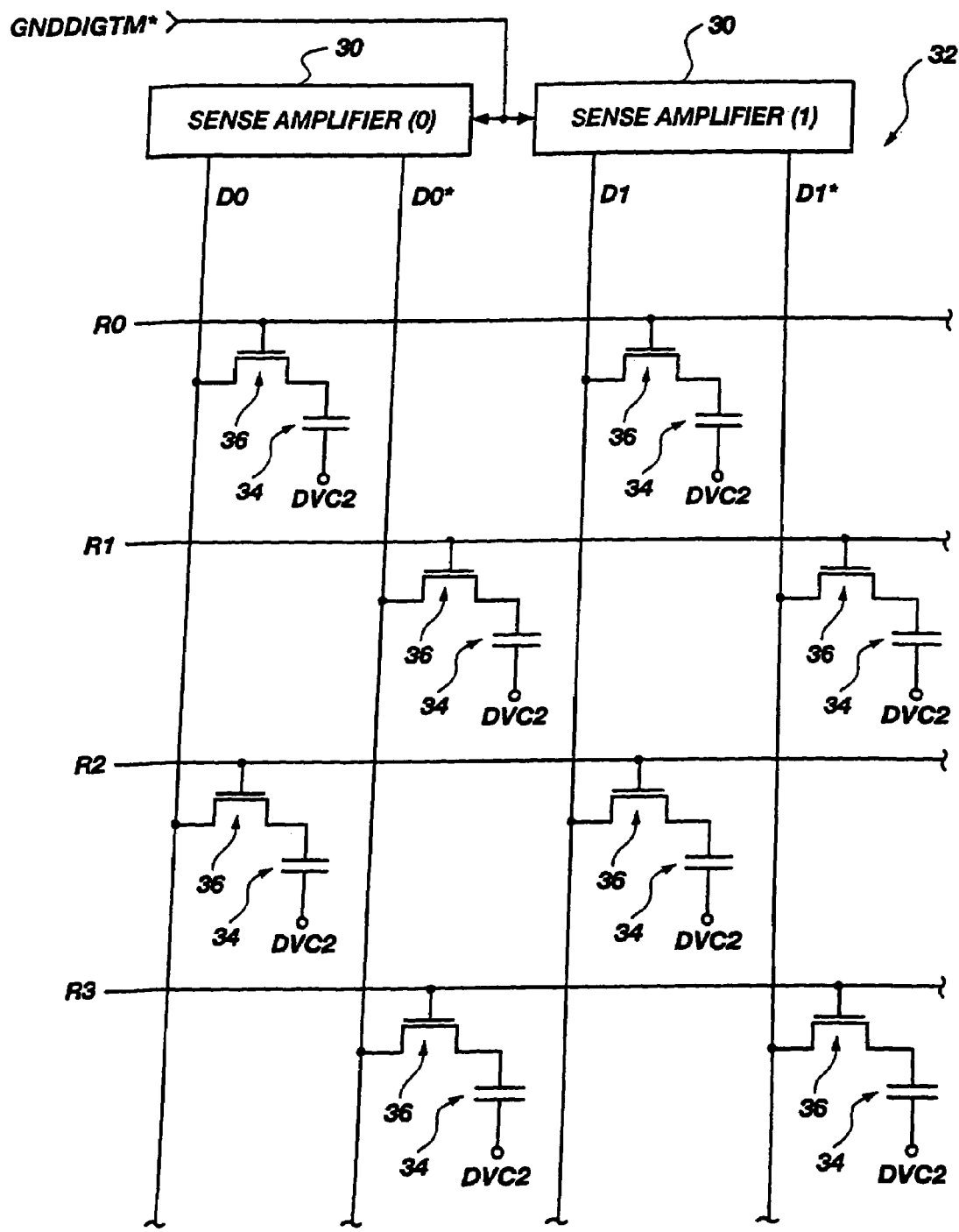
FIG. 3 is a schematic and block diagram illustrating circuitry for margin testing a Dynamic Random Access Memory (DRAM) according to the present invention.

As shown in FIG. 3, the invention includes margin testing circuitry (see FIG. 4) incorporated into sense amplifiers 30 of a Dynamic Random Access Memory (DRAM) 32 or other semiconductor memory. It should be understood by those having skill in the technical field of the invention that the margin testing circuitry may be directly connected to digit lines D0, D0*, D1, D1*, etc., of the DRAM 32 instead of being incorporated into the sense amplifiers 30, or may be incorporated into other circuitry of the DRAM 32 that is connected to the digit lines D0, D0*, D1, D1*, etc.

A margin test is performed on the DRAM 32 in accordance with the invention by first storing a supply voltage $V_{CC}$ level in the storage capacitors 34 of the DRAM 32 using the sense amplifiers 30, digit lines D0, D0*, D1, D1*, etc., row lines R0, R1, R2, R3, etc., and NMOS access devices 36 of memory cells of the DRAM 32. An active margin test mode signal GNDDIGTM* then causes the sense amplifiers 30 to ground the digit lines D0, D0*, D1, D1*, etc., for a predetermined refresh interval of about 150 to 200 milliseconds. Of course, longer or shorter refresh intervals may also be used. Grounding the digit lines D0, D0*, D1, D1*, etc., stresses the NMOS access devices 36 with a $V_{CC}$-to-ground voltage drop, causing any of the NMOS access devices 36 that are leaky to leak charge. GNDDIGTM* then causes the sense amplifiers 30 to ground the digit lines D0, D0*, D1, D1*, etc. for a predetermined refresh interval of about 150 to 200 milliseconds. Of course, longer or shorter refresh intervals may also be used. Grounding the digit lines D0, D0*, D1, D1*, etc. stresses the NMOS access devices 36 with a $V_{CC}$-to-ground voltage drop, causing any of the NMOS access devices 36 that are leaky to leak charge.

After the predetermined refresh interval has passed, all the memory cells of the DRAM 32 are read. Any that leaked sufficient charge to read out at a low voltage level rather than at the supply voltage $V_{CC}$ level they originally stored are then identified as having failed the margin test.

It should be understood that the invention grounds all digit lines D0, D0*, D1, D1*, etc., at the same time without the need to fire any of the row lines R0, R1, R2, R3, etc. As a result, the invention margin tests all sub-arrays within the DRAM 32 at the same time, in contrast to the traditional margin test method previously described.

It should also be understood that stressing voltages other than ground may be applied to the digit lines D0, D0*, D1, D1*, etc., during a margin test, and that, accordingly, different voltages may be stored on the storage capacitors 34 to begin the margin test. For example, the storage capacitors 34 may store a ground voltage level while a supply voltage $V_{CC}$ level is uniformly applied to the digit lines D0, D0*, D1, D1*, etc., to stress the NMOS access devices 36.

Figure 4:
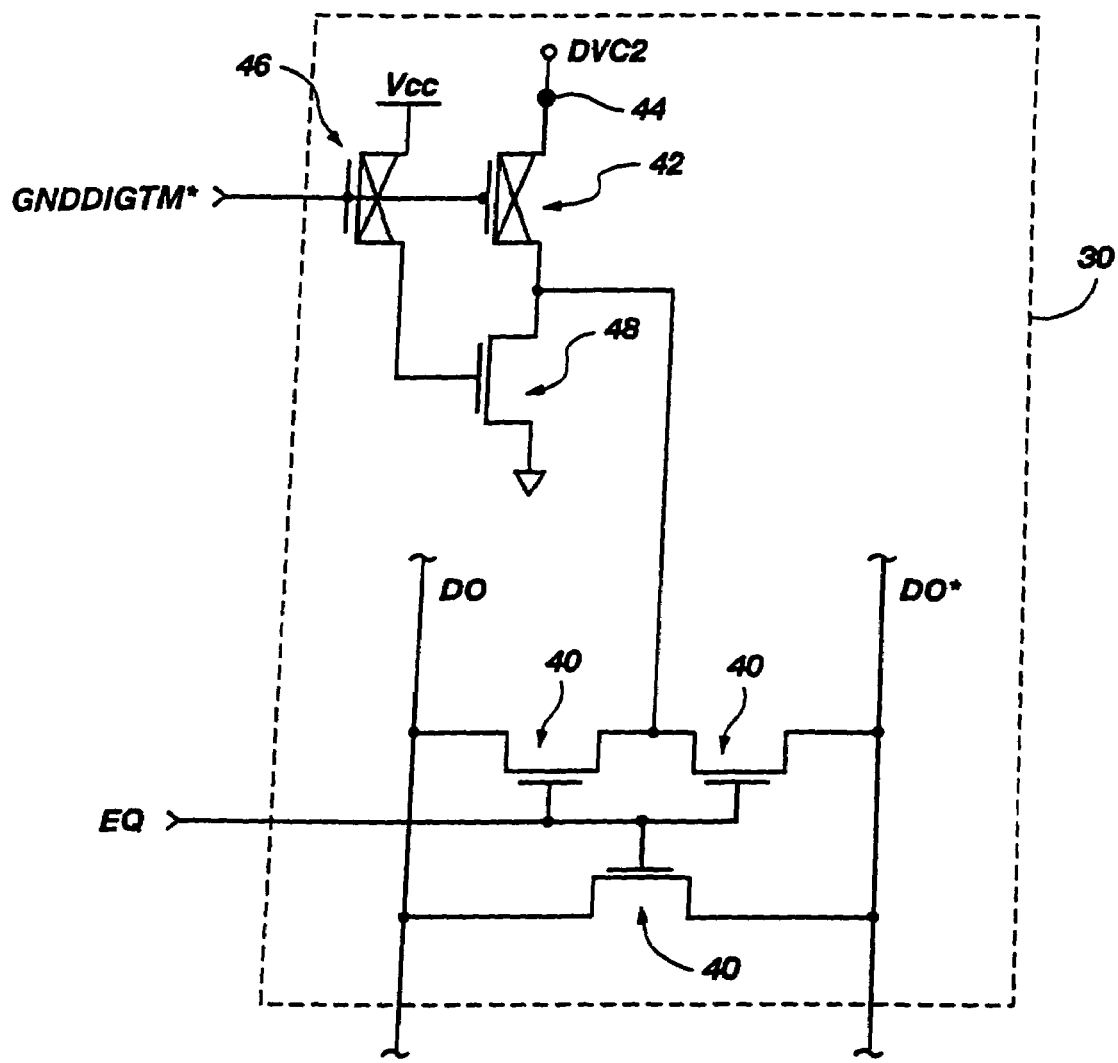
FIG. 4 is a more detailed schematic view of the circuitry of FIG. 3.

As shown in FIG. 4, one of the sense amplifiers 30 includes equilibrating NMOS transistors 40 for equilibrating the voltage on the digit lines D0, D0*. During normal memory operations, the margin test mode signal GNDDIGTM* is inactive, which causes an isolating NMOS transistor 42 to be active and couple the equilibrating NMOS transistors 40 to an equilibrate bias node 44 connected to the cell plate voltage DVC2. During the margin test mode, the margin test mode signal GNDDIGTM* is active, causing the isolating NMOS transistor 42 to isolate the equilibrating NMOS transistors 40 from the equilibrate bias node 44, and causing a PMOS switching transistor 46 to turn on and activate an NMOS switching transistor 48, thereby applying a ground voltage to the equilibrating NMOS transistors 40. In response to an active equilibrate signal EQ, the equilibrating NMOS transistors 40 in turn apply the ground voltage to the digit lines D0 and D0* simultaneously.

It should be noted that because the invention does not attempt to isolate the equilibrate bias node 44 from the cell plate voltage DVC2, but rather provides an isolating NMOS transistor 42 for each sense amplifier 30 to individually isolate each pair of digit lines from the equilibrate bias node 44, the invention provides a more reliable margin test method than the known probe pad method previously described, which does attempt to isolate the equilibrate bias node 44 from the cell plate voltage DVC2 and the cell plate.

In an alternative system as described above, in which the switching transistors 46 and 48 are directly connected to digit lines D0 and D0* rather than being connected through equilibrating NMOS transistors 40, or are incorporated into circuitry other than the sense amplifier 30 that is directly connected to the digit lines D0 and D0*, an alternative method for isolating the digit lines D0 and D0* from the equilibrate bias node 44 in accordance with the invention involves not activating the equilibrate signal EQ.

Figure 5:
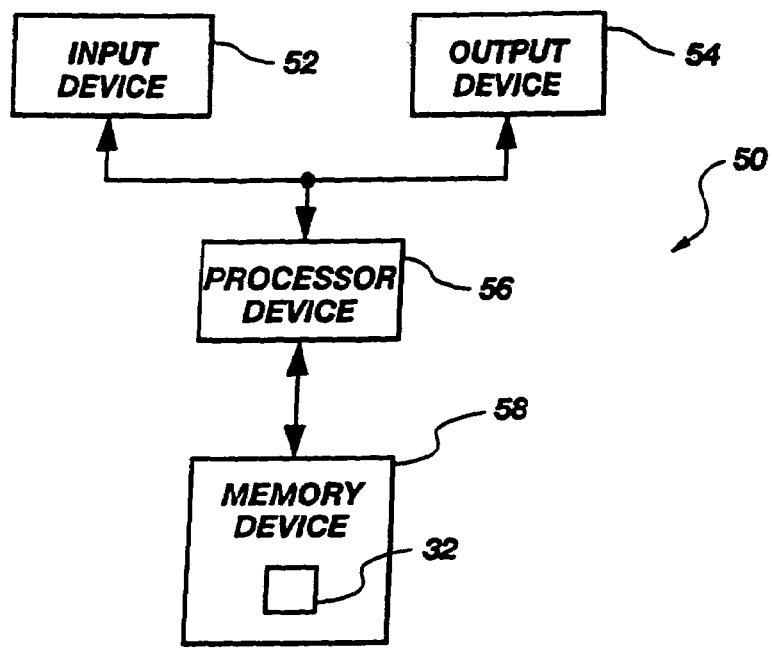
FIG. 5 is a block diagram of an electronic system including a memory device that incorporates the DRAM and circuitry of FIG. 3.
Figure 6:
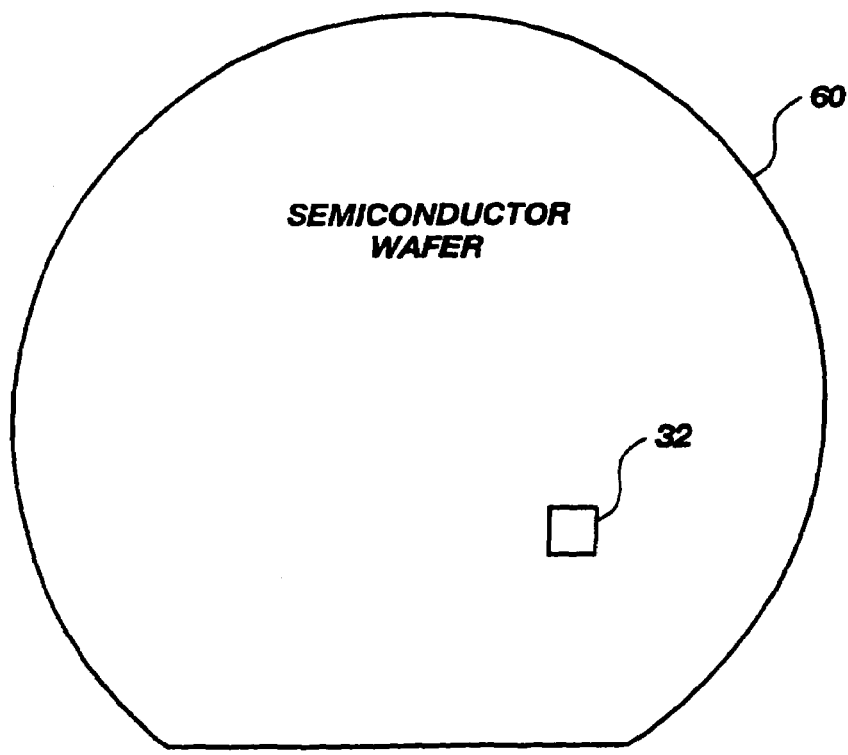
FIG. 6 is a diagram of a semiconductor wafer that incorporates the DRAM and circuitry of FIG. 3.

As shown in FIG. 5, an electronic system 50 in accordance with the invention includes an input device 52, an output device 54, a processor device 56, and a memory device 58 incorporating the DRAM 32 of FIG. 3. As shown in FIG. 6, the DRAM 32 of FIG. 3 is fabricated on a semiconductor wafer 60. Of course, it should be understood that semiconductor substrates other than a semiconductor wafer also fall within the scope of the present invention, including, for example, Silicon-on-Sapphire (SOS) substrates, Silicon-on-Glass (SOG) substrates, and Silicon-on-Insulator (SOI) substrates.

Although the present invention has been described with reference to particular embodiments, the invention is not limited to these described embodiments. Rather, the invention is limited only the appended claims, which include within their scope all equivalent devices or methods that operate according to the principles of the invention as described.

What is claimed is:

1. A semiconductor device having a memory comprising:
   a memory array including a plurality of memory cells and a plurality of pairs of complementary digit lines coupled to at least one memory cell of the plurality of memory cells; and
   a plurality of sense amplifiers, each sense amplifier of the plurality of sense amplifiers including:
   isolating circuitry coupled between an equilibrate bias node of the memory and one pair of digit lines of the plurality of pairs of complementary digit lines of the memory array for isolating the one pair of digit lines from the equilibrate bias node and a cell plate voltage thereon during a margin test mode of the memory, the cell plate voltage including one of a voltage less than a supply voltage and a voltage substantially the same as the supply voltage; and
   switching circuitry coupled to the one pair of digit lines for providing a ground voltage during the margin test mode for stressing substantially simultaneously the at least one memory cell of the plurality of memory cells of the memory array, the switching circuitry including a one transistor.

2. The semiconductor device of claim 1, wherein the switching circuitry comprises one or more NMOS transistors.

3. The semiconductor device of claim 1, wherein the cell plate voltage comprises one-half of the supply voltage of the memory.

4. A method of margin testing a memory device having a plurality of memory cells, a plurality of sense amplifiers, and a plurality of digit line pairs attached to the plurality of memory cells and the plurality of digit line pairs, the method comprising:
   storing a high voltage level in the plurality of memory cells;
   isolating equilibrating circuitry in the plurality of sense amplifiers from an equilibrate bias node of the memory device and from a cell plate voltage thereon;
   applying a ground voltage from within the memory device to the equilibrating circuitry in each sense amplifier of the plurality;
   equilibrating the plurality of digit line pairs to the ground voltage using the equilibrating circuitry in each sense amplifier of the plurality;

holding the plurality of digit line pairs at the ground voltage for a predetermined refresh interval in order to stress the plurality of memory cells; and reading all the plurality of memory cells to identify those that have failed the margin test after the predetermined refresh interval has passed.

5. The method of claim 4, wherein the act of storing a high voltage level in the plurality of memory cells comprises storing a supply voltage level in the plurality of memory cells.

6. The method of claim 4, wherein the acts of isolating the equilibrating circuitry and applying the ground voltage both include activating a margin test mode signal.

7. The method of claim 4, wherein the act of isolating the equilibrating circuitry comprises deactivating an NMOS transistor coupled between the equilibrating circuitry and the equilibrate bias node.

8. The method of claim 4, wherein the act of applying the ground voltage to the equilibrating circuitry comprises activating an NMOS transistor coupled between the equilibrating circuitry and ground.

9. The method of claim 4, wherein the act of equilibrating the plurality of digit line pairs includes activating an equilibrate signal.

10. The method of claim 4, wherein the act of holding the plurality of digit line pairs at the ground voltage for a predetermined refresh interval comprises holding the plurality of digit line pairs at the ground voltage for a predetermined refresh interval of between approximately 150 and 200 milliseconds.

11. A method of testing a semiconductor memory having memory cells and a plurality of digit line pairs attached thereto, the method comprising:

storing a substantially identical logic voltage in all the memory cells of the semiconductor memory;

isolating the plurality of digit line pairs of the semiconductor memory from a digit line equilibrating bias voltage;

applying a stressing voltage from within the semiconductor memory to all the digit lines of the plurality of digit line pairs at substantially the same time, the stressing voltage being substantially different than the substantially identical logic voltage stored in the memory cells so the memory cells are stressed by application of the stressing voltage to the digit lines of the plurality of digit line pairs;

holding the plurality of digit line pairs at the stressing voltage for a predetermined interval; and reading all the memory cells of the semiconductor memory to identify those that have failed the test.

12. The method of claim 11, wherein the act of storing a substantially identical logic voltage comprises storing a logic voltage selected from a group comprising a supply voltage and a ground voltage.

13. The method of claim 11, wherein the act of isolating the plurality of digit line pairs from a digit line equilibrating bias voltage comprises isolating the plurality of digit line pairs from a voltage selected from a group comprising a supply voltage and a cell plate voltage equal to one-half the supply voltage.

14. The method of claim 11, wherein the act of applying a stressing voltage comprises applying a stressing voltage selected from a group comprising a ground voltage and a supply voltage.

15. The method of claim 11, wherein the act of isolating the plurality of digit line pairs from the digit line equilibrating bias voltage comprises not activating equilibrating circuitry coupled between the equilibrating bias voltage and the plurality of digit line pairs that normally is activated during memory operations of the semiconductor memory.

16. A method of margin testing a memory having a plurality of memory cells, a plurality of sense amplifiers, and a plurality of digit line pairs attached to the plurality of memory cells and the plurality of digit line pairs, the method comprising:

storing a high voltage level in the plurality of memory cells;

isolating equilibrating circuitry in the plurality of sense amplifiers from an equilibrate bias node of the memory and from a cell plate voltage thereon;

applying a ground voltage from within the memory to the equilibrating circuitry in each sense amplifier of the plurality;

equilibrating the plurality of digit line pairs to the ground voltage using the equilibrating circuitry in each sense amplifier;

holding the plurality of digit line pairs at the ground voltage for a predetermined refresh interval in order to stress the plurality of memory cells; and reading all the plurality of memory cells of the plurality to identify those that have failed the margin test.

17. The method of claim 16, wherein the act of storing a high voltage level in the plurality of memory cells comprises storing a supply voltage level in the plurality of memory cells.

18. The method of claim 16, wherein the acts of isolating the equilibrating circuitry and applying the ground voltage both include activating a margin test mode signal.

19. The method of claim 16, wherein the act of isolating the equilibrating circuitry comprises deactivating an NMOS transistor coupled between the equilibrating circuitry and the equilibrate bias node.

20. The method of claim 16, wherein the act of applying the ground voltage to the equilibrating circuitry comprises activating an NMOS transistor coupled between the equilibrating circuitry and ground.

21. The method of claim 16, wherein the act of equilibrating the plurality of digit line pairs includes activating an equilibrate signal.

22. The method of claim 16, wherein the act of holding the plurality of digit line pairs at the ground voltage for a predetermined refresh interval comprises holding the plurality of digit line pairs at the ground voltage for a predetermined refresh interval of between approximately 150 and 200 milliseconds.

23. A method of testing a semiconductor memory having a plurality of memory cells and a plurality of digit line pairs attached to the plurality of memory cells, the method comprising:

storing a substantially identical logic voltage in the plurality of memory cells of the semiconductor memory;

isolating the plurality of digit line pairs of the semiconductor memory from a digit line equilibrating bias voltage;

applying a stressing voltage from within the semiconductor memory to all the digit lines of the plurality of digit line pairs at substantially the same time, the stressing voltage being substantially different than the logic voltage stored in the plurality of memory cells so that the plurality of memory cells are stressed by application of the stressing voltage to the digit lines;

holding the plurality of digit line pairs at the stressing voltage for a predetermined interval;

reading the plurality of memory cells of the semiconductor memory to identify those that have failed the test; and identifying the plurality of memory cells of the semiconductor memory that have failed the test.

24. The method of claim 23, wherein the act of storing a substantially identical logic voltage comprises storing a logic voltage selected from a group comprising a supply voltage and a ground voltage.

25. The method of claim 23, wherein the act of isolating the plurality of digit line pairs from a digit line equilibrating bias voltage comprises isolating the plurality of digit line pairs from a voltage selected from a group comprising a supply voltage and a cell plate voltage equal to one-half the supply voltage.

26. The method of claim 23, wherein the act of applying a stressing voltage comprises applying a stressing voltage selected from a group comprising a ground voltage and a supply voltage.

27. The method of claim 23, wherein the act of isolating the plurality of digit line pairs from the digit line equilibrating bias voltage comprises not activating equilibrating circuitry coupled between the bias voltage and the plurality of digit line pairs that normally is activated during memory operations of the semiconductor memory.

28. A method of margin testing a memory device of a plurality of memory devices in wafer form, the memory device having a plurality of memory cells, a plurality of sense amplifiers, and a plurality of digit line pairs attached to the plurality of memory cells and the plurality of digit line pairs, the method comprising:

storing a high voltage level in the plurality of memory cells;

isolating equilibrating circuitry in the plurality of sense amplifiers from an equilibrate bias node of the memory device and from a cell plate voltage thereon;

applying a ground voltage from within the memory device to the equilibrating circuitry in each sense amplifier of the plurality;

equilibrating the plurality of digit line pairs to the ground voltage using the equilibrating circuitry in each sense amplifier of the plurality;

holding the plurality of digit line pairs at the ground voltage for a predetermined refresh interval in order to stress the plurality of memory cells; and reading all the plurality of memory cells of the plurality to identify those that have failed the margin test.

29. The method of claim 28, wherein the act of storing a high voltage level in the plurality of memory cells comprises storing a supply voltage level in the plurality of memory cells.

30. The method of claim 28, wherein the acts of isolating the equilibrating circuitry and applying the ground voltage both include activating a margin test mode signal.

31. The method of claim 28, wherein the act of isolating the equilibrating circuitry comprises deactivating an NMOS transistor coupled between the equilibrating circuitry and the equilibrate bias node.

32. The method of claim 28, wherein the act of applying the ground voltage to the equilibrating circuitry comprises activating an NMOS transistor coupled between the equilibrating circuitry and ground.

33. The method of claim 28, wherein the act of equilibrating the plurality of digit line pairs includes activating an equilibrate signal.

34. The method of claim 28, wherein the act of holding the plurality of digit line pairs at the ground voltage for a predetermined refresh interval comprises holding the plurality of digit line pairs at the ground voltage for a predetermined refresh interval of between approximately 150 and 200 milliseconds.

35. A method of testing a semiconductor memory having memory cells and a plurality of digit line pairs attached thereto of a plurality of semiconductor memories in wafer form, the method comprising:

storing a substantially identical logic voltage in all the memory cells of the semiconductor memory;

isolating the plurality of digit line pairs of the semiconductor memory from a digit line equilibrating bias voltage;

applying a stressing voltage from within the semiconductor memory to all the digit lines of the plurality of digit line pairs at substantially the same time, the stressing voltage being substantially different than the logic voltage stored in the memory cells so that the memory cells are stressed by application of the stressing voltage to the digit lines of the plurality of digit line pairs;

holding the plurality of digit line pairs at the stressing voltage for a predetermined interval; and reading all the memory cells of the semiconductor memory to identify those that have failed the test.

36. The method of claim 35, wherein the act of storing a substantially identical logic voltage comprises storing a logic voltage selected from a group comprising a supply voltage and a ground voltage.

37. The method of claim 35, wherein the act of isolating the plurality of digit line pairs from a digit line equilibrating bias voltage comprises isolating the plurality of digit line pairs from a voltage selected from a group comprising a supply voltage and a cell plate voltage equal to one-half the supply voltage.

38. The method of claim 35, wherein the act of applying a stressing voltage comprises applying a stressing voltage selected from a group comprising a ground voltage and a supply voltage.

39. The method of claim 35, wherein the act of isolating the plurality of digit line pairs from the digit line equilibrating bias voltage comprises not activating equilibrating circuitry coupled between the bias voltage and the plurality of digit line pairs that normally is activated during memory operations of the semiconductor memory.

40. A method of margin testing a memory device in an electronic system having an input device, an output device, and a processor device, the memory device having a plurality of memory cells, a plurality of sense amplifiers, and a plurality of digit line pairs attached to the plurality of memory cells, the method comprising:

storing a high voltage level in the plurality of memory cells;

isolating equilibrating circuitry in the plurality of sense amplifiers from an equilibrate bias node of the memory device and from a cell plate voltage thereon;

applying a ground voltage from within the memory device to the equilibrating circuitry in each sense amplifier of the plurality of sense amplifiers;

equilibrating the plurality of digit line pairs to the ground voltage using the equilibrating circuitry in each sense amplifier of the plurality;

holding the plurality of digit line pairs at the ground voltage for a predetermined refresh interval in order to stress the plurality of memory cells; and reading all the plurality of memory cells of the plurality to identify those that have failed the margin test.

41. The method of claim 40, wherein the act of storing a high voltage level in the plurality of memory cells comprises storing a supply voltage level in the plurality of memory cells.

42. The method of claim 40, wherein the acts of isolating the equilibrating circuitry and applying the ground voltage both include activating a margin test mode signal.

43. The method of claim 40, wherein the act of isolating the equilibrating circuitry comprises deactivating an NMOS transistor coupled between the equilibrating circuitry and the equilibrate bias node.

44. The method of claim 40, wherein the act of applying the ground voltage to the equilibrating circuitry comprises activating an NMOS transistor coupled between the equilibrating circuitry and ground.

45. The method of claim 40, wherein the act of equilibrating the plurality of digit line pairs includes activating an equilibrate signal.

46. The method of claim 40, wherein the act of holding the plurality of digit line pairs at the ground voltage for a predetermined refresh interval comprises holding the plurality of digit line pairs at the ground voltage for a predetermined refresh interval of between approximately 150 and 200 milliseconds.

47. A method of testing a semiconductor memory having memory cells and a plurality of digit line pairs attached thereto, the semiconductor memory in an electronic system having an input device, an output device, and a processor, the method comprising:

storing a substantially identical logic voltage in all the memory cells of the semiconductor memory;

isolating the plurality of digit line pairs of the semiconductor memory from a digit line equilibrating bias voltage;

applying a stressing voltage from within the semiconductor memory to all the digit lines of the plurality of digit line pairs at substantially the same time, the stressing voltage being substantially different than the substantially identical logic voltage stored in the memory cells so the memory cells are stressed by application of the stressing voltage to the digit lines of the plurality of digit line pairs;

holding the plurality of digit line pairs at the stressing voltage for a predetermined interval; and reading all the memory cells of the semiconductor memory to identify those that have failed the test.

48. The method of claim 47, wherein the act of storing a substantially identical logic voltage comprises storing a logic voltage selected from a group comprising a supply voltage and a ground voltage.

49. The method of claim 47, wherein the act of isolating the plurality of digit line pairs from a digit line equilibrating bias voltage comprises isolating the plurality of digit line pairs from a voltage selected from a group comprising a supply voltage and a cell plate voltage equal to one-half the supply voltage.

50. The method of claim 47, wherein the act of applying a stressing voltage comprises applying a stressing voltage selected from a group comprising a ground voltage and a supply voltage.

51. The method of claim 47, wherein the act of isolating the plurality of digit line pairs from the digit line equilibrating bias voltage comprises not activating equilibrating circuitry coupled between the bias voltage and the plurality of digit line pairs that normally is activated during memory operations of the semiconductor memory.

52. A method of margin testing a Dynamic Random Access Memory (DRAM) having a plurality of memory cells, a plurality of sense amplifiers, and a plurality of digit line pairs attached to the plurality of memory cells, the method comprising:

storing a high voltage level in the plurality of memory cells;

isolating equilibrating circuitry in the plurality of sense amplifiers from an equilibrate bias node of the DRAM and from a cell plate voltage thereon;

applying a ground voltage from within the DRAM to the equilibrating circuitry in each sense amplifier;

equilibrating the plurality of digit line pairs to the ground voltage using the equilibrating circuitry in each sense amplifier of the plurality;

holding the plurality of digit line pairs at the ground voltage for a predetermined refresh interval in order to stress the plurality of memory cells; and after the predetermined refresh interval has passed, reading all the plurality of memory cells to identify those that have failed the margin test.

53. The method of claim 52, wherein the act of storing a high voltage level in the plurality of memory cells comprises storing a supply voltage level in the plurality of memory cells.

54. The method of claim 52, wherein the acts of isolating the equilibrating circuitry and applying the ground voltage both include activating a margin test mode signal.

55. The method of claim 52, wherein the act of isolating the equilibrating circuitry comprises deactivating an NMOS transistor coupled between the equilibrating circuitry and the equilibrate bias node.

56. The method of claim 52, wherein the act of applying the ground voltage to the equilibrating circuitry comprises activating an NMOS transistor coupled between the equilibrating circuitry and ground.

57. The method of claim 52, wherein the act of equilibrating the plurality of digit line pairs includes activating an equilibrate signal.

58. The method of claim 52, wherein the act of holding the plurality of digit line pairs at the ground voltage for a predetermined refresh interval comprises holding the plurality of digit line pairs at the ground voltage for a predetermined refresh interval of between approximately 150 and 200 milliseconds.

59. A method of testing a semiconductor memory having memory cells and a plurality of digit line pairs attached thereto, the method comprising:

storing a substantially identical logic voltage in all the memory cells of the semiconductor memory;

isolating the plurality of digit line pairs of the semiconductor memory from a digit line equilibrating bias voltage;

applying a stressing voltage from within the semiconductor memory to all the digit lines of all of the plurality of digit line pairs, the stressing voltage being substantially different than the substantially identical logic voltage stored in the memory cells for stressing the memory cells by application of the stressing voltage to the digit lines of all the plurality of digit line pairs;

holding the plurality of digit line pairs at the stressing voltage for a predetermined interval; and reading all the memory cells of the semiconductor memory to identify those that have failed the test.

60. The method of claim 59, wherein the act of storing a substantially identical logic voltage comprises storing a logic voltage selected from a group comprising a supply voltage and a ground voltage.

61. The method of claim 59, wherein the act of isolating the plurality of digit line pairs from a digit line equilibrating bias voltage comprises isolating the plurality of digit line pairs from a voltage selected from a group comprising a supply voltage and a cell plate voltage equal to one-half the supply voltage.

62. The method of claim 59, wherein the act of applying a stressing voltage comprises applying a stressing voltage selected from a group comprising a ground voltage and a supply voltage.

63. The method of claim 59, wherein the act of isolating the plurality of digit line pairs from the digit line equilibrating bias voltage comprises not activating equilibrating circuitry coupled between the bias voltage and the plurality of digit line pairs that normally is activated during memory operations of the semiconductor memory.

* * * * *